US008947083B2

(12) United States Patent
Nakajima et al.

(10) Patent No.: US 8,947,083 B2
(45) Date of Patent: Feb. 3, 2015

(54) CURRENT DETECTING APPARATUS

(71) Applicant: Sumitomo Wiring Systems, Ltd., Yokkaichi, Mie (JP)

(72) Inventors: Hirokatsu Nakajima, Yokkaichi (JP); Satoru Chaen, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 87 days.

(21) Appl. No.: 13/647,946

(22) Filed: Oct. 9, 2012

(65) Prior Publication Data
US 2013/0147474 A1 Jun. 13, 2013

(30) Foreign Application Priority Data

Dec. 9, 2011 (JP) ................................. 2011-269648

(51) Int. Cl.
G01R 33/04 (2006.01)
G01R 15/20 (2006.01)

(52) U.S. Cl.
CPC .................................. *G01R 15/207* (2013.01)
USPC ................... 324/253; 324/117 H; 324/117 R; 324/127

(58) Field of Classification Search
None
See application file for complete search history.

(56) References Cited

U.S. PATENT DOCUMENTS 4,972,140 A * 11/1990 Okazaki et al. ........... 324/117 H

FOREIGN PATENT DOCUMENTS

| JP | 07086769 A | * | 3/1995 |
| JP | 07260829 A | * | 10/1995 |
| JP | A-2004-101384 | | 4/2004 |

OTHER PUBLICATIONS

Machine English translation of Japanese Patent Application Publication to Inventor S Kajiya et. al. JP 1995-086769 A, Mar. 31, 1995. Translation of pp. 2-5 created on Feb. 21, 2014.*
Machine English translation of Japanese Patent Application Publication to Inventor Minoru Noda. JP 1995-260829 A, Oct. 13, 1995. Translation of pp. 2-4 created on Feb. 11, 2014.*

* cited by examiner

*Primary Examiner* — Melissa Koval
*Assistant Examiner* — Stephen G Armstrong
(74) *Attorney, Agent, or Firm* — Oliff PLC

(57) ABSTRACT

In a current detecting apparatus, a container member which constitutes a insulating housing includes an element supporting portion, a connector supporting portion, and a substrate fixing portion. The element supporting portion is formed with a depression to which a magnetism detecting portion of a Hall element is fitted. The connector supporting portion achieves positioning of a body portion of the connector by a fitting structure in three-dimensional directions where a lead terminal of a connector extends in parallel with lead terminals of the Hall element. The substrate fixing portion is a portion where a circuit board is fixed at one point. The body portion of the connector is also fixed to the circuit board with a screw.

6 Claims, 6 Drawing Sheets

CURRENT DETECTING APPARATUS

This application claims priority to Japanese Application No. 2011-269648 filed on Dec. 9, 2011, the entire disclosure of which is hereby incorporated by reference in its entirety.

Exemplary embodiments relate to a current detecting apparatus configured to detect electric current flowing through a transmission channel such as a bus bar.

BACKGROUND

Vehicles such as hybrid automobiles or electric vehicles include a current detecting apparatus configured to detect electric current flowing through a bus bar connected to a battery mounted thereon in many cases. Examples of such a current detecting apparatus which may be employed include a current detecting apparatus of a magnetic proportion system or a current detecting apparatus of a magnetic balance system.

The current detecting apparatus of the magnetic proportion system or of the magnetic balance system includes, as described in JP-A-2004-101384 for example, a magnetic core and a magnetoelectric device (magnetic induction device). The magnetic core is a substantially ring-shaped magnetic body having ends facing each other via a gap portion therebetween and formed continuously so as to surround the periphery of a hollow portion where the bus bar penetrates. The hollow portion of the magnetic body is a space where the detected current passes through.

The magnetoelectric device is a device configured to be arranged at the gap portion of the magnetic core, detect a magnetic flux which varies with a current flowing through the transmission channel such as the bus bar arranged through the hollow portion, and output a detection signal of the magnetic flux as an electric signal. A Hall element is generally employed as the magnetoelectric device.

As described in JP-A-2004-101384, in the current detecting apparatus, the magnetic core and the magnetoelectric device are held at a certain positional relationship by a housing having insulating properties in many cases. The housing sets up the positioning of a plurality of components which constitute the current detecting apparatus to a certain positional relationship. The housing is generally formed of a resin member having insulating properties.

As described in JP-A-2004-101384, a magnetism detecting portion of the magnetoelectric device is arranged at the gap portion of the magnetic core, and a lead terminal extending from the magnetism detecting portion is secured to a circuit board by soldering together with the lead terminal of a connector connected to a cable with a connector for transmitting a signal and other electronic components and the like. The circuit board thereof is fixed to screw seats provided on parts of the housing with screws.

For example, in the example described in JP-A-2004-101384, a body portion of the connector is formed as part of the housing, and the lead terminal of the connector is secured to the circuit board to be mounted in the housing. The lead terminal of the magnetoelectric device is secured to the circuit board in advance.

In FIG. 5 of JP-A-2004-101384, positioning of the magnetism detecting portion of the magnetoelectric device which is achieved by a resin member arranged in the gap portion of the magnetic core is illustrated.

SUMMARY

However, as described in JP-A-2004-101384, when the body portion of the connector is formed as part of the housing of the current detecting apparatus, and the lead terminal of the connector is assembled to the housing, it is difficult to attach the elongated metal lead terminals to each housing with high degree of positional accuracy in a process of assembling the current detecting apparatuses.

In the current detecting apparatus, if the position of the lead terminal of the connector is deviated from its original position, disadvantages as described below may result. For example, there may occur an event such that the circuit board formed with a hole to allow insertion of the lead terminal of the connector cannot be assembled to the housing correctly (mounting error of components). Also, since the position of the circuit board is deviated from its original position, the position of the magnetoelectric device mounted on the circuit board is deviated from its correct position, or current detection accuracy may be deteriorated due to an application of a needless stress to the magnetism detecting portion of the magnetoelectric device.

From these reasons, in the current detecting apparatus to be mounted on a vehicle, it may be preferable that a general-purpose connector including the body portion and the lead terminal integrated with high degree of dimensional accuracy in advance (commercially available connector) is employed, and such a general-purpose connector may be mounted on the circuit board. However, in this case, highly accurate positioning of the magnetoelectric device and the connector with respect to the circuit board on which these members are mounted in a simple assembling process may be important.

To address the above and other problems, a novel a current detecting apparatus in which a general-purpose connector may be employed and highly accurate positioning of a magnetoelectric device and a connector with respect to a circuit board on which these members are mounted may be achieved in a simple assembling process, thereby preventing mounting error of components and deterioration of current detection accuracy.

A current detecting apparatus according to a first embodiment includes respective components described below.

(1) A first component may be a magnetic core formed of a magnetic material, having both ends facing each other via a gap portion held therebetween, and formed continuously so as to surround the periphery of a hollow portion.

(2) A second component may be a magnetoelectric device including a magnetism detecting portion to be arranged in the gap portion of the magnetic core and a first lead terminal extending from the magnetism detecting portion, and configured to detect a magnetic flux configured to vary with electric current passing through the hollow portion of the magnetic core.

(3) A third component may be a connector having a body portion and a second lead terminal extending from the body portion.

(4) A fourth component may be a circuit board to which the first lead terminal may be secured, the second lead terminal may also be secured, and the body portion of the connector may be fixed.

(5) A fifth component may be a housing including a container member and a lid member to be combined with the container member each formed of an integrally molded member of a resin material having insulating properties, and the container member may be configured to accommodate and support the magnetic core, the magnetoelectric device, and the circuit board in a certain positional relationship. Furthermore, the container member of the housing may include an element supporting portion, a connector supporting portion, and a substrate fixing portion. The element supporting portion may be a portion that forms a depression in which the magnetism detecting portion of the magnetoelectric conversion element may be fitted at a position of the gap portion of the magnetic core. The connector supporting portion may be a portion configured to achieve positioning of the body portion of the connector by a fitting structure in three directions orthogonal to each other including the first direction in a state in which the second lead terminal extends in parallel to the first lead terminal of the magnetoelectric device whose positioning may be achieved by the element supporting portion. The substrate fixing portion may be a portion where a circuit board may be fixed at one point thereof.

In the current detecting apparatus according to a second embodiment, there may be provided a plurality of projecting portions formed so as to project from a first side surface from among four side surfaces thereof, the first side surface facing toward one side of the first direction parallel to the direction in which the second lead terminal extends, and the projecting portions coming into contact with the circuit board at top portions thereof. Furthermore, in the current detecting apparatus according to the second mode, the connector supporting portion may include a pair of first connector restricting portions, a second connector restricting portion, and third connector restricting portions. The pair of first connector restricting portions may be a pair of portions configured to come into contact with a second side surface and a third side surface located on both sides of the first side surface of the body portion of the connector to restrict a movement of the body portion of the connector in a second direction orthogonal to the first direction. The second connector restricting portion may be a portion configured to come into contact with a fourth side surface opposite the first side surface of the body portion of the connector to restrict the movement of the body portion of the connector toward the other side of the first direction. The third connector restricting portion may be a portion formed so as to protrude from both sides of the fourth side surface of the body portion of the connector and enter between the plurality of projecting portions of the body portion of the connector fitted between the pair of first connector restricting portions, and configured to come into contact with side surfaces of the plurality of projecting portions of the body portion of the connector and also come into contact with the first side surface of the body portion of the connector and restrict the movement of the body portion of the connector toward the one side of the first direction and in the third direction orthogonal to the first direction and the second direction.

In the current detecting apparatus according to a third embodiment, the second connector restricting portion of the connector supporting portion may include a plurality of apprentice portions. The plurality of apprentice portions may be portions formed so as to protrude from both sides of the fourth side surface of the body portion of the connector in a state of coming into surface contact with chamfered portions of the fourth side surface of the body portion of the connector at edges on both sides which constitute boundary portions respectively with respect to the second side surface and the third side surface. In addition, the plurality of apprentice portions may each be formed to be gradually thinner from a root portion, which comes into contact with an end of the fourth side surface, toward a distal end portion thereof. Furthermore, in the current detecting apparatus according to the third embodiment, a remaining portion of the fourth side surface of the body portion of the connector, other than portions that the apprentice portions of the second connector restricting portion contact, may be entirely exposed from the housing.

In a current detecting apparatus according to this disclosure, a general-purpose connector including the body portion and the lead terminals integrated into a unit may be employed. Positioning of the magnetism detecting portion of the magnetoelectric device and the body portion of the connector may be achieved by the container member in a state in which the lead terminals extend in parallel in the same direction by such a simple assembling process as to fit into part of the container member. The container member, which may be an integrally molded member formed of a resin material, may be formed with high degree of dimensional accuracy. Therefore, positioning of the lead terminals of the magnetoelectric device and the lead terminals of the connector with high degree of accuracy may be achieved by the container member.

Therefore, even when the circuit board is assembled to the container member after the magnetoelectric device and the connector have been assembled to the container member, the circuit board may be assembled to a correct position. Consequently, a problem that the position of the magnetoelectric device mounted on the circuit board is deviated from the correct position, and a problem that the needless stress is applied to the magnetism detecting portion of the magnetoelectric device may be avoided, and deterioration of the current detection accuracy caused by these problems may also be avoided.

Generally, in order that the circuit board is firmly fixed to the container member, the circuit board needs to be fixed to the container member at least at two points. In contrast, in the current detecting apparatus according to exemplary embodiments, positioning of the connector to be fixed to the circuit board may be achieved by the connector supporting portion of the container member in the three-dimensional directions.

Therefore, according to exemplary embodiments, the circuit board may be brought into a state of being substantially fixed to the container member at two points of the substrate fixing portion and the connector supporting portion only by being fixed at one point. Consequently, the assembling process may be simplified in a state in which the strength of fixation of the circuit board with respect to the container member may be sufficiently secured.

From the description given above, according to exemplary embodiments, in the current detecting apparatus, the magnetoelectric device, the connector, and the circuit board on which the magnetoelectric device and the connector are mounted may be firmly fixed with a high degree of positional accuracy while employing the general-purpose connector in the simple assembling process. Consequently, the mounting error of the components may be prevented, and variations in detection accuracy of the current detecting apparatus may be reduced.

Incidentally the general-purpose connector which may be fixable to the circuit board with a screw or the like includes a plurality of projecting portions configured to come into contact at the top portions thereof with the circuit board in many cases. For example, the body portion of the connector as described above may be formed with two screw seats which are projecting portions formed respectively with screw holes to allow the screws to be screwed therein and two column portions which are projecting portions formed to have the same height as the screw seats in many cases.

According to the current detecting apparatus of the second embodiment, positioning of the connector may be achieved by the connector supporting portion having a simple structure by using the plurality of projecting portions provided on the general-purpose connector.

Also, the general-purpose connector may be chamfered at boundary portions (corner portions) of the four side surfaces in many cases. In the third embodiment, the apprentice portions which constitute the second connector restricting portion may be formed to have a thickness which fills the chamfered portions on the side surface of the connector. Therefore, according to the third embodiment, by using the chamfered portions on the side surface of the general-purpose connector, the dimension in the first direction of the container member (the housing) may be reduced.

A circuit board may be fixed to a substrate fixing portion with measures other than a screw. For example, a distal end portion of the substrate fixing portion penetrating through a second through hole of the circuit board may be molded by a heater to have a shape larger than the second through hole. Accordingly, the circuit board may be fixed by being held tightly between a shouldered portion and a portion formed with a distal end of the substrate fixing portion. In this case, the distal end portion on the distal side of the shouldered portion of the substrate fixing portion may be formed so as to be longer than the thickness of the circuit board.

DETAILED DESCRIPTION OF EMBODIMENTS

Figure 1:
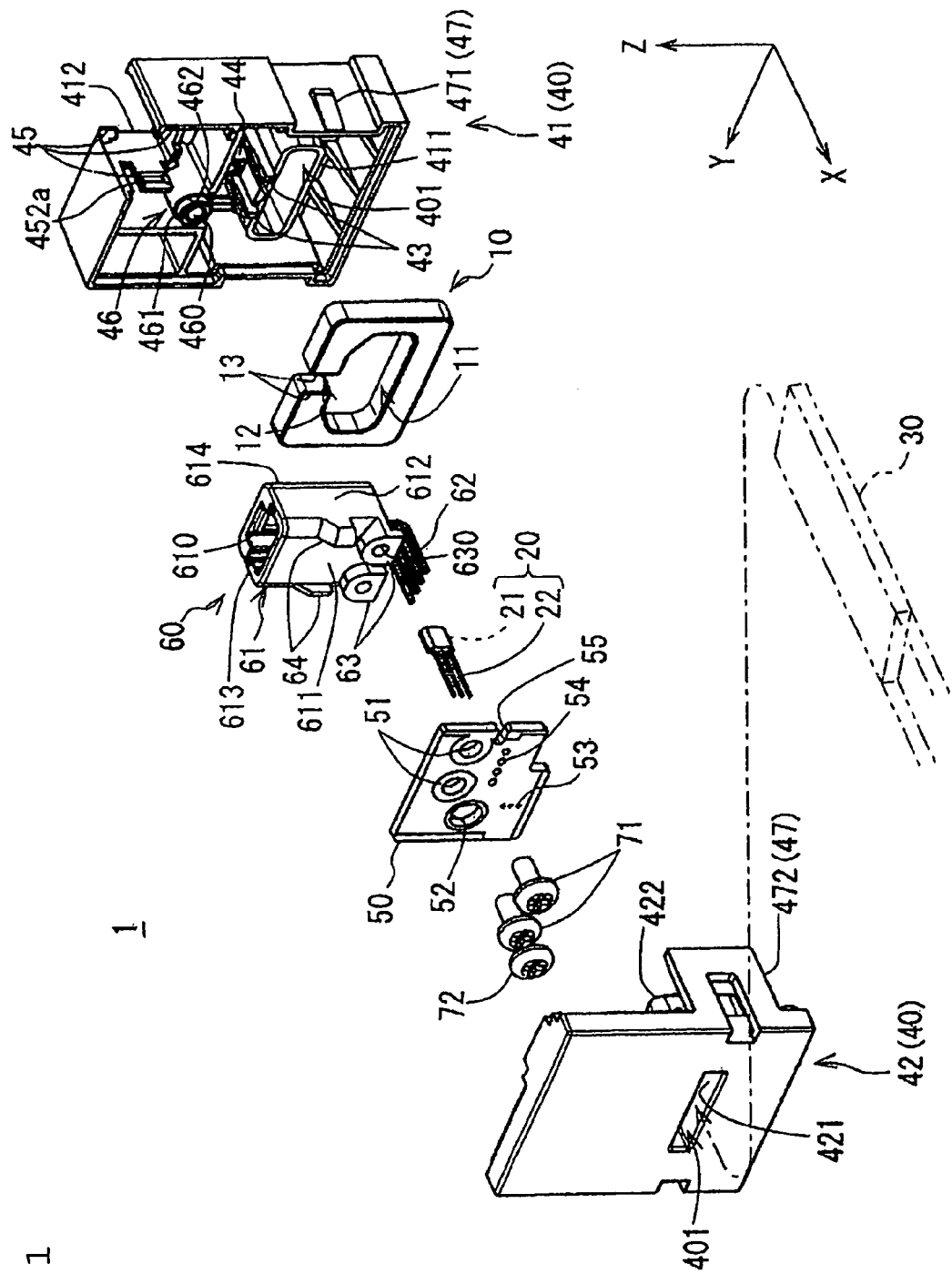
FIG. 1 is an exploded side view of a current detecting apparatus 1 according to an embodiment.

Referring now to the drawings, exemplary embodiments will be described. The exemplary embodiments described below are given only for illustration of an example, and are not intended for limiting the technical scope of the invention.

Figure 2:
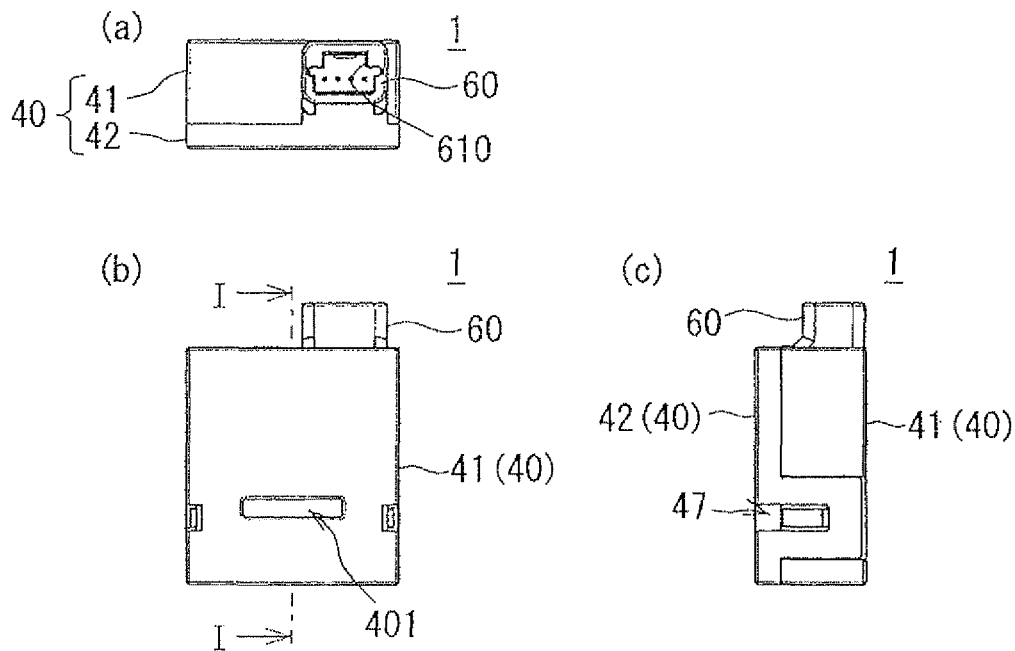
FIG. 2 is three-side views of the current detecting apparatus 1.
Figure 3:
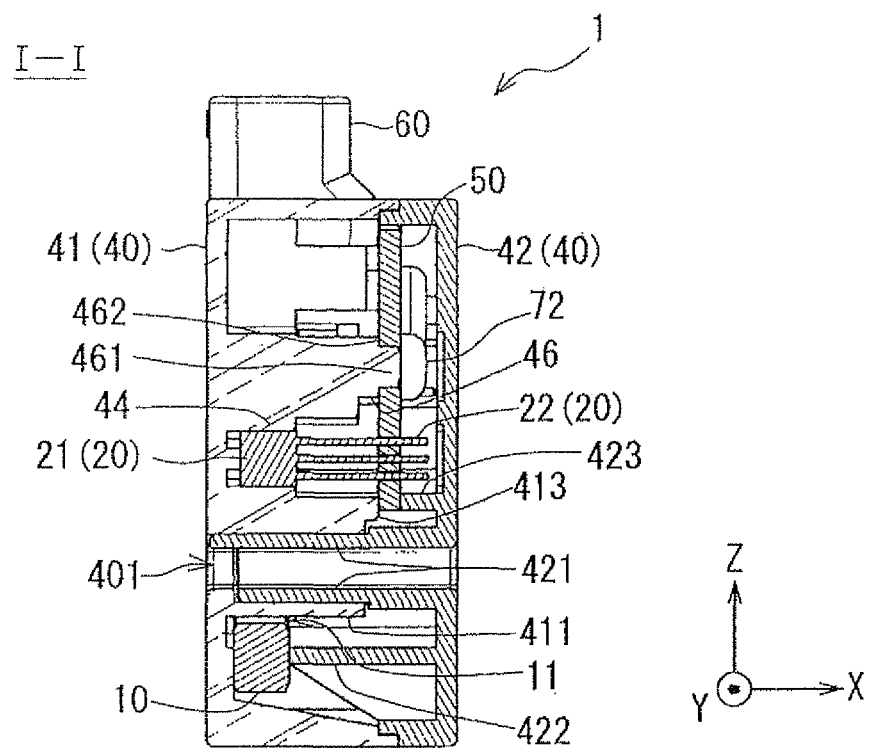
FIG. 3 is a vertical cross-sectional view of the current detecting apparatus 1.

Referring first to FIG. 1 to FIG. 3, a schematic configuration of a current detecting apparatus 1 according to exemplary embodiments will be described. The current detecting apparatus 1 may be an apparatus configured to detect electric current flowing through a bus bar which electrically connects a battery and equipment such as a motor in vehicles such as electric vehicles or hybrid automobiles. As illustrated in FIG. 1, the current detecting apparatus 1 includes a magnetic core 10, a Hall element 20, an insulating housing 40, a circuit board 50, a connector 60, first screws 71 and a second screw 72.

As illustrated in FIG. 1 and FIG. 2, the insulating housing 40 includes a container member 41 and a lid member 42 configured to be assembled to each other. The circuit board 50 may be a substrate on which the Hall element 20 and the connector 60 may be mounted.

In the description given below, a direction in which the container member 41 and the lid member 42, which constitute the insulating housing 40, are assembled, that is, a direction in which the container member 41 and the lid member 42 face, is referred to as a first direction. A direction of the width of the insulating housing 40 orthogonal to the first direction is referred to as a second direction. A direction of height of the insulating housing 40 orthogonal to the first direction and the second direction is referred to as a third direction. In coordinate axes illustrated in the respective drawings, an X-axis direction indicates the first direction, a Y-axis direction indicates the second direction, and a Z-axis direction indicates the third direction.

FIG. 2 (a) is a plan view of the current detecting apparatus 1, FIG. 2 (b) is a front view of the current detecting apparatus 1, and FIG. 2(c) is a side view of the current detecting apparatus 1. FIG. 3 is a cross-sectional view of the current detecting apparatus 1 in a I-I plane illustrated in FIG. 2 (b).

<Magnetic Core>

The magnetic core 10 may be a member formed of a magnetic material such as ferrite or silicon steel. The magnetic core 10 may have a shape having both end portions 13 facing each other via a gap portion 12 of approximately several millimeters therebetween and formed continuously so as to surround the periphery of a hollow portion 11. In other words, the magnetic core 10 including the narrow gap portion 12 may be formed into a ring shape.

In an embodiment, the magnetic core 10 including the gap portion 12 may be formed into a substantially rectangular ring shape surrounding the hollow portion 11 of a rectangular shape with rounded corners. There is also a case where the magnetic core 10 including the gap portion 12 may be formed into a circular ring shape surrounding the circular hollow portion 11.

A transmission channel 30 such as a bus bar through which electric current to be detected flows may be arranged so as to penetrate through the hollow portion 11 of the magnetic core 10. In FIG. 1, the transmission channel 30 is illustrated by an imaginary line (double-dashed chain line).

<Hall Element (Magnetoelectric Device)>

The Hall element 20 may be a sensor configured to detect a magnetic flux in the gap portion 12 of the magnetic core 10. In an embodiment, the Hall element 20 may be an IC of a lead wire type including a magnetism detecting portion 21 as a main body portion of the element and a plurality of lead terminals 22 protruded from a bottom surface of the magnetism detecting portion 21. The plurality of lead terminals 22 may include a terminal for inputting power and a terminal for outputting a detection signal. The plurality of lead terminals 22 may be inserted into Hall element mounting holes 53 formed on the circuit board 50, and may be secured to a wiring pattern of the circuit board 50 by soldering.

The magnetism detecting portion 21 of the Hall element 20 may be arranged in the gap portion 12 of the magnetic core 10. In this state, the Hall element 20 detects a magnetic flux which varies with electric current passing through the hollow portion 11 of the magnetic core 10, and outputs the detection signal of the magnetic flux as the electric signal. The Hall element 20 is an example of the magnetoelectric device.

The Hall element 20 detects the magnetic flux passing through a detection center, which may be a predetermined portion of the magnetism detecting portion 21 along a predetermined direction with the highest sensitivity. In general, a reference straight line indicating a route of the magnetic flux detected by the Hall element 20 with highest degree of sensitivity passes a substantial center of the magnetism detecting portion, and is a straight line orthogonal to front and back surfaces of the magnetism detecting portion 21.

In the current detecting apparatus 1, a state in which the detection center of the magnetism detecting portion 21 is located at a center point of the gap portion 12 of the magnetic core 10, and the reference straight line of the magnetism detecting portion 21 overlaps with a straight line connecting centers of projecting surfaces of the facing both end portions 13 of the magnetic core 10 may be an ideal state of arrangement of the magnetism detecting portion 21.

<Circuit Board and Connector>

The circuit board 50 may be a printed circuit board on which a portion of the lead terminals 22 of the Hall element 20 may be mounted. The circuit board 50 may be provided with a lead terminal 62 of the connector 60 and a circuit configured to perform, for example, a stabilization process for the detection signal of the magnetic flux output from the Hall element 20 mounted thereon with in addition to the Hall element 20.

The circuit board 50 may be formed with two first through holes 51 which allow penetration of two of the first screws 71 respectively and one second through hole 52 which allows penetration of the one second screw 72. In the current detecting apparatus 1, the first screws 71 may be screws for fixing a body portion 61 of the connector 60 to the circuit board 50. The second screw 72 may be a screw for fixing the circuit board 50 to the container member 41 of the insulating housing 40.

The connector 60 may be a component to which a counterpart connector provided on an electric cable, not shown, is connected. The connector 60 may be provided with the body portion 61 and the lead terminal 62. The body portion 61 may be a portion where there is a connecting port 610 to which the counterpart connector is connected. The lead terminal 62 may be a terminal having electrical conductivity configured to electrically connect a metallic terminal in the body portion 61 and a wiring pattern of the circuit board 50.

The plurality of the lead terminals 62 of the connector 60 may be inserted into connector mounting holes 54 formed on the circuit board 50, and may be secured to the wiring pattern of the circuit board 50 by soldering.

The connector 60 employed in an embodiment might not be a component specifically manufactured for the current detecting apparatus 1, but may be a general-purpose connector which may be employed for other apparatuses. Therefore, the body portion 61 and the lead terminals 62 may be integrated in advance with high degree of positional accuracy.

The circuit board 50 may be provided with a circuit configured to electrically connect the lead terminals 22 of the Hall element 20 and the lead terminals 62 of the connector 60. For example, the circuit board 50 may be provided with a circuit configured to supply power input from the outside via an electric wire and the connector 60 to the lead terminals 22 of the Hall element 20, a circuit configured to perform, for example, the stabilization process with respect to a detection signal of the Hall element 20 and output the processed signal to the lead terminals 62 of the connector 60 and the like. Accordingly, the current detecting apparatus 1 may be allowed to output a current detection signal to an external circuit of an electronic control unit or the like through the electric wire with a connector which may be connected to the connector 60.

In the following description, a side surface, out of four side surfaces of the body portion 61 of the connector 60 facing the circuit board 50, is referred to as a first side surface 611. The first side surface 611 is also a surface facing toward one side of the first direction (the positive side of the X-axis). Two side surfaces out of the four side surfaces of the body portion 61 of the connector 60 positioned on both sides of the first side surface 611 are referred to as a second side surface 612 and a third side surface 613, respectively. The second side surface 612 and the third side surface 613 are also surfaces facing one side (the negative side of the Y-axis) and the other side (the positive side of the Y-axis) of the second direction. A side surface out of the four side surfaces of the body portion 61 of the connector 60 positioned opposite the first side surface 611 is referred to as a fourth side surface 614.

The body portion 61 of the connector 60 may be formed with two screw seats 63 which are projecting portions formed respectively with screw holes 630 to allow the two first screws 71 to be screwed therein on top portions thereof and two column portions 64 which are projecting portions formed to have the same height as the screw seats 63.

More specifically, the two screw seats 63 may project from edge portions which define boundaries of the first side surface 611 of the body portion 61 with respect to the second side surface 612 and the third side surface 613. In the same manner, the two column portions 64 also project from the edge portions which define boundaries of the first side surface 611 of the body portion 61 with respect to the second side surface 612 and the third side surface 613 at a distance respectively with respect to the two screw seats 63.

The body portion 61 of the connector 60 may be fixed to the circuit board 50 at two positions with the two first screws 71 in a state in which the respective top portions of the two screw seats 63 and the two column portions 64 come into contact with the surface of the circuit board 50. Since the four projecting portions composed of the screw seats 63 and the column portions 64 having the same height come into contact with the surface of the circuit board 50, the body portion 61 of the connector 60 may be fixed in a stable posture with respect to the circuit board 50.

<Insulating Housing>

The container member 41 and the lid member 42, which constitute the insulating housing 40, may respectively be integral molded members formed of a resin material having insulating properties. The container member 41 and the lid member 42 may respectively be integral molded members formed of resin having insulating properties such as polyamide (PA), polypropylene (PP) or an ABS resin.

The container member 41 may be formed into a box-shape having an opening and the lid member 42 closes the opening of the container member 41 by being assembled to the container member 41. The container member 41 and the lid member 42 may be formed with a current pass hole 401 as a through hole which allows insertion of the transmission channel 30.

The container member 41 may be formed with a cylindrical outer frame portion 411 surrounding the periphery of the current pass hole 401 on an inner surface thereof. In the same manner, the lid member 42 may be formed with a cylindrical inner frame portion 421 surrounding the periphery of the current pass hole 401 on an inner surface thereof. When the container member 41 and the lid member 42 are combined, the inner frame portion 421 may be fitted inside of the outer frame portion 411, and a double cylinder may be formed. The outer frame portion 411 and the inner frame portion 421 constitute an electrical shield between the transmission channel 30 such as the bus bar penetrating through the current pass hole 401 and the components mounted on the circuit board 50.

The container member 41 may be a member configured to support and accommodate the magnetic core 10, the Hall element 20, the circuit board 50, and the connector 60 in a certain positional relationship. However, the connector 60 may be accommodated in the insulating housing 40 in a state of being partly exposed. The container member 41 may be formed with a void portion 412 which exposes the fourth side surface 614 of the connector 60.

More specifically, a core supporting portion 43, an element supporting portion 44, and a connector supporting portion 45 configured to support the magnetic core 10, the Hall element 20, and the body portion 61 of the connector 60 respectively at predetermined positions may be formed inside the container member 41. Furthermore, a substrate fixing portion 46 to which the circuit board 50 may be fixed at one point thereof may also be formed inside the container member 41. A supporting structure of the respective components will be described.

The lid member 42 may be assembled to the container member 41 which supports the magnetic core 10, the Hall element 20, the connector 60, and the circuit board 50 while holding the magnetic core 10 and the circuit board 50 tightly in-between in a state of closing the opening of the container member 41.

The container member 41 and the lid member 42 may be provided with a lock mechanism 47 configured to hold the container member 41 and the lid member 42 in a combined state. The lock mechanism 47 illustrated in FIG. 1 includes a claw portion 471 formed so as to project from a side surface of the container member 41 and a ring-shaped frame portion 472 formed on the side of the lid member 42. With the claw portion 471 of the container member 41 fitted into a hole formed on the frame portion 472 of the lid member 42, the container member 41 and the lid member 42 may be held in a state of being combined.

<Supporting Structure of Magnetic Core>

Referring now to FIG. 4 to FIG. 6, FIG. 10 and FIG. 11, a supporting structure of the magnetic core 10 in the insulating housing 40 will be described.

Figure 4:
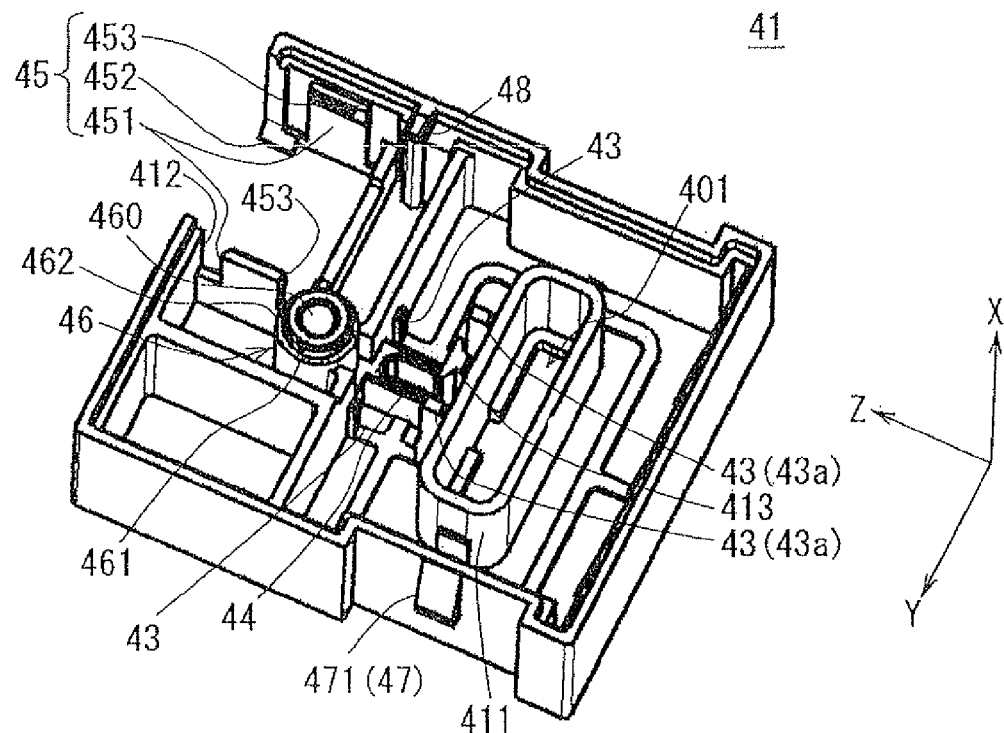
FIG. 4 is a perspective view of a container member which constitutes a housing of the current detecting apparatus 1.
Figure 5:
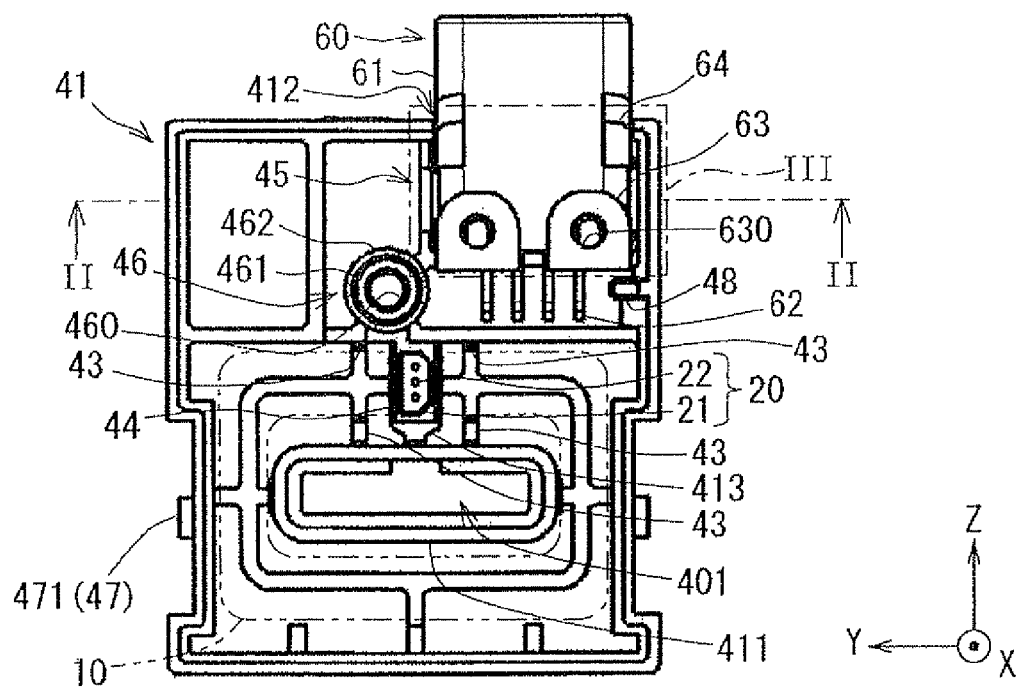
FIG. 5 is an internal view of the container member configured to support a Hall element and a connector.
Figure 6:
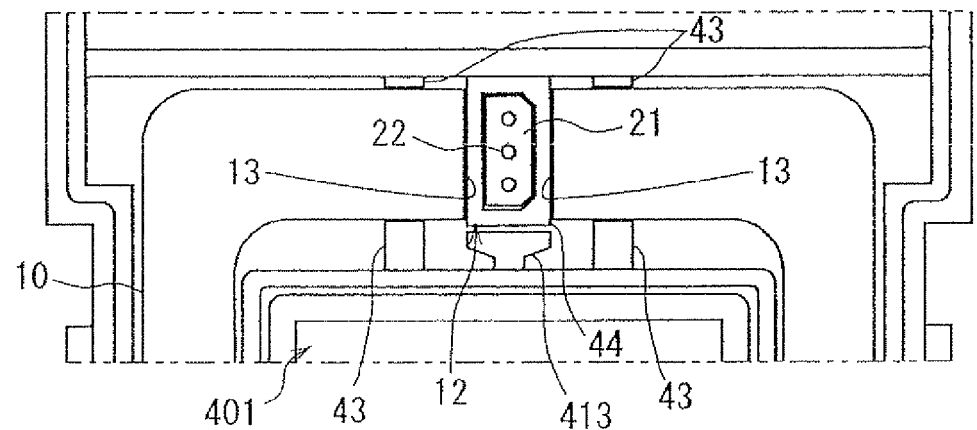
FIG. 6 is a front view of a portion configured to support a magnetic core in the container member.
Figure 10:
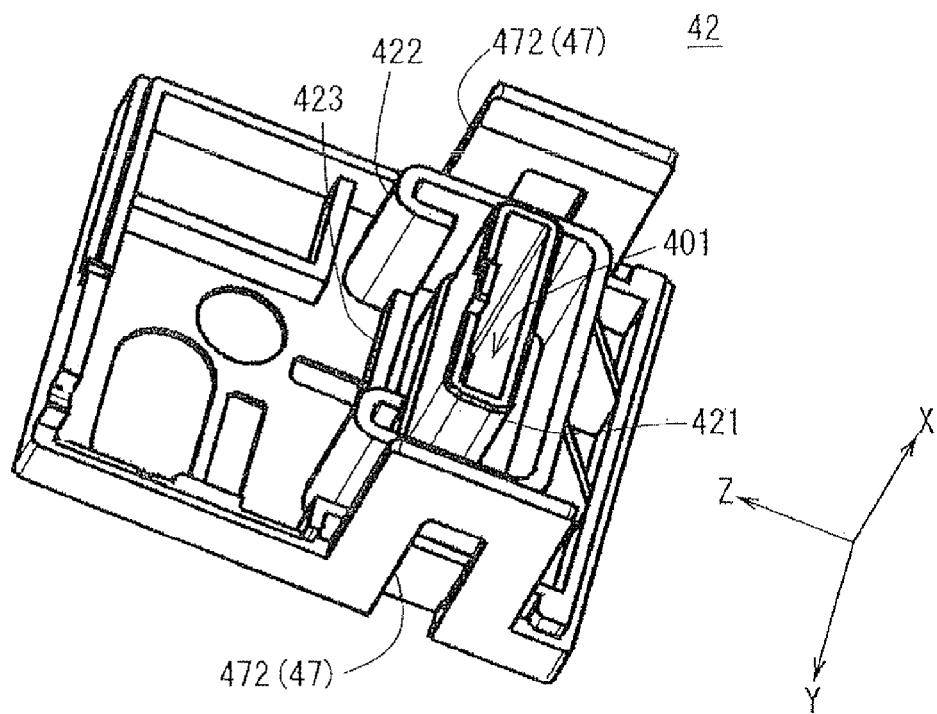
FIG. 10 is a perspective view of a lid member which constitutes the housing of the current detecting apparatus 1.
Figure 11:
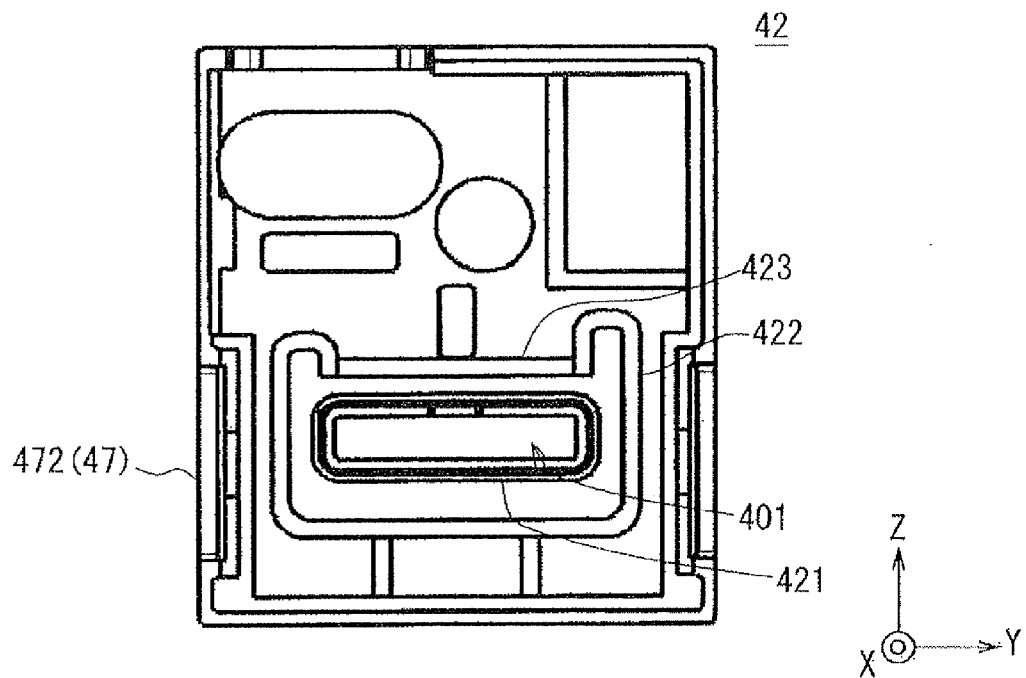
FIG. 11 is an internal view of the lid member which constitutes the housing of the current detecting apparatus 1.

FIG. 4 is a perspective view of the container member 41 which constitutes the insulating housing 40. FIG. 5 is an internal view of the container member 41 which supports the Hall element 20 and the connector 60. FIG. 6 is a front view of a portion configured to support the magnetic core 10 in the container member 41. FIG. 10 is a perspective view of the lid member 42 which constitutes the insulating housing 40. FIG. 11 is an internal view of the lid member 42.

As illustrated from FIG. 4 to FIG. 6, the core supporting portions 43 configured to support the magnetic core 10 may be formed so as to project form the inner surface of the container member 41. The core supporting portions 43 may include a plurality of projecting portions, and the plurality of projecting portions may support the magnetic core 10 by holding part of the magnetic core 10 tightly therebetween. In FIG. 5, the magnetic core 10 is illustrated by an imaginary line (double-dashed chain line).

In an embodiment, as illustrated in FIG. 6, the four of the core supporting portions 43 may support the magnetic core 10 by holding portions in the vicinity of the both end portions 13 of the magnetic core 10 tightly therebetween. Accordingly, the core supporting portions 43 may restrict the movement of the magnetic core 10 in the third direction (Z-axis direction).

The inner surface of the container member 41 may be formed with the element supporting portion 44 so as to extend upright into the gap portion 12 of the magnetic core 10 supported by the core supporting portions 43. The element supporting portion 44 restricts the movement of the magnetic core 10 in the second direction (Y-axis direction) by being fitted into the gap portion 12 of the magnetic core 10. As described later, the element supporting portion 44 may be a portion configured to support the Hall element 20, and may also be a portion configured to restrict the movement of the magnetic core 10.

The magnetic core 10 is illustrated in FIG. 6 in a state in which positioning may be achieved by the core supporting portions 43 and the element supporting portion 44 of the container member 41.

As illustrated in FIG. 10 and FIG. 11, a core holding portion 422 may be formed so as to project from the inner surface of the lid member 42. The magnetic core 10 may be held tightly between the inner surface of the container member 41 and the core holding portion 422 of the lid member 42, whereby the movement of the magnetic core 10 in the first direction (X-axis direction) may be restricted.

As described thus far, positioning of the magnetic core 10 in the three-dimensional directions may be achieved by the core supporting portions 43, the element supporting portion 44, and the core holding portion 422 and the like, and the magnetic core 10 may be held at a predetermined position in the insulating housing 40.

<Supporting Structure of Hall Element>

Referring now to FIG. 4 to FIG. 6, a supporting structure of the Hall element 20 in the insulating housing 40 will be described.

As illustrated in FIG. 4 to FIG. 6, the inner surface of the container member 41 may be formed with the element supporting portion 44 so as to extend upright into the gap portion 12 of the magnetic core 10 supported by the core supporting portions 43. The element supporting portion 44 may be formed with a depression at a position of the gap portion 12 of the magnetic core 10 so as to allow the magnetism detecting portion 21 of the Hall element 20 to be fitted therein. In an embodiment, the element supporting portion 44 may be formed into a wall shape surrounding a hollow portion (depression) to allow the magnetism detecting portion 21 to be fitted therein.

The element supporting portion 44 may support the magnetism detecting portion 21 of the Hall element 20 at a predetermined position by coming into contact with the magnetism detecting portion 21 of the Hall element 20 fitted into the depression formed therein from the periphery thereof. Accordingly, the Hall element 20 may be held in a state in which the lead terminals 22 extend in parallel to the first direction (x-axis direction).

The element supporting portion 44 may hold the position of the Hall element 20 mainly in the second direction and the third direction (Y-Z plane direction). The Hall element 20 may be an extremely light-weight component. Therefore, the element supporting portion 44 may be capable of maintaining the position of the Hall element 20 to some extent also in the first direction (X-axis direction) by a frictional resistance between the inner surface thereof and the magnetism detecting portion 21 of the Hall element 20.

As described later, the circuit board 50 may be fixed in the container member 41 in a state in which positioning of the magnetism detecting portion 21 of the Hall element 20 is achieved by the element supporting portion 44. At this time, the lead terminals 22 of the Hall element 20 may be fitted into the Hall element mounting holes 53 of the circuit board 50. Then, the lead terminals 22 of the Hall element 20 may be secured to the circuit board 50 by soldering. Therefore, the position of the Hall element 20 in the first direction (X-axis direction) may be held by the fixed circuit board 50.

<Supporting Structure of Connector>

Figure 7:
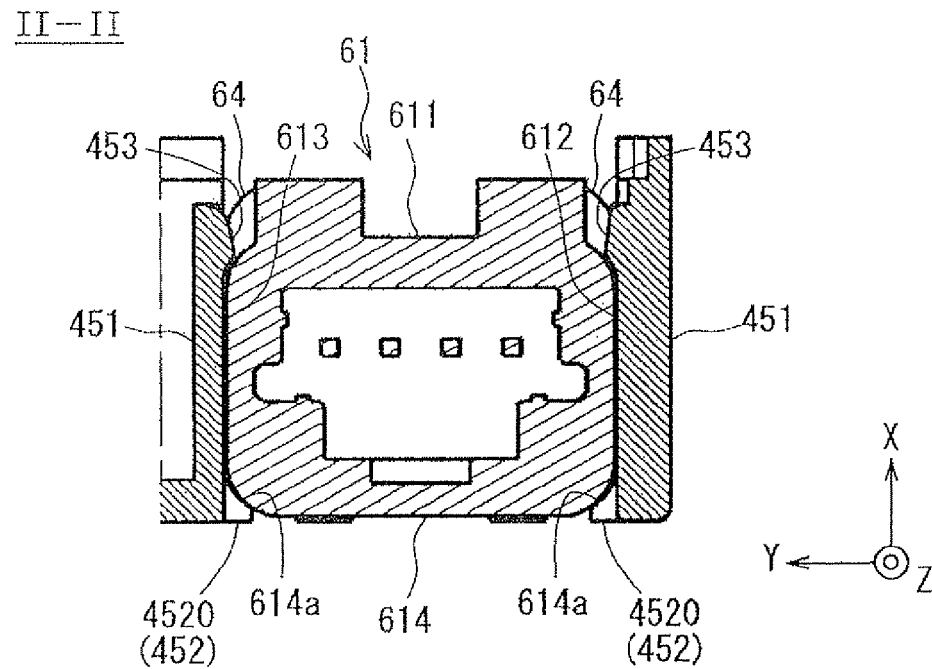
FIG. 7 is a lateral cross-sectional view of a connector supporting portion configured to support the connector.
Figure 8:
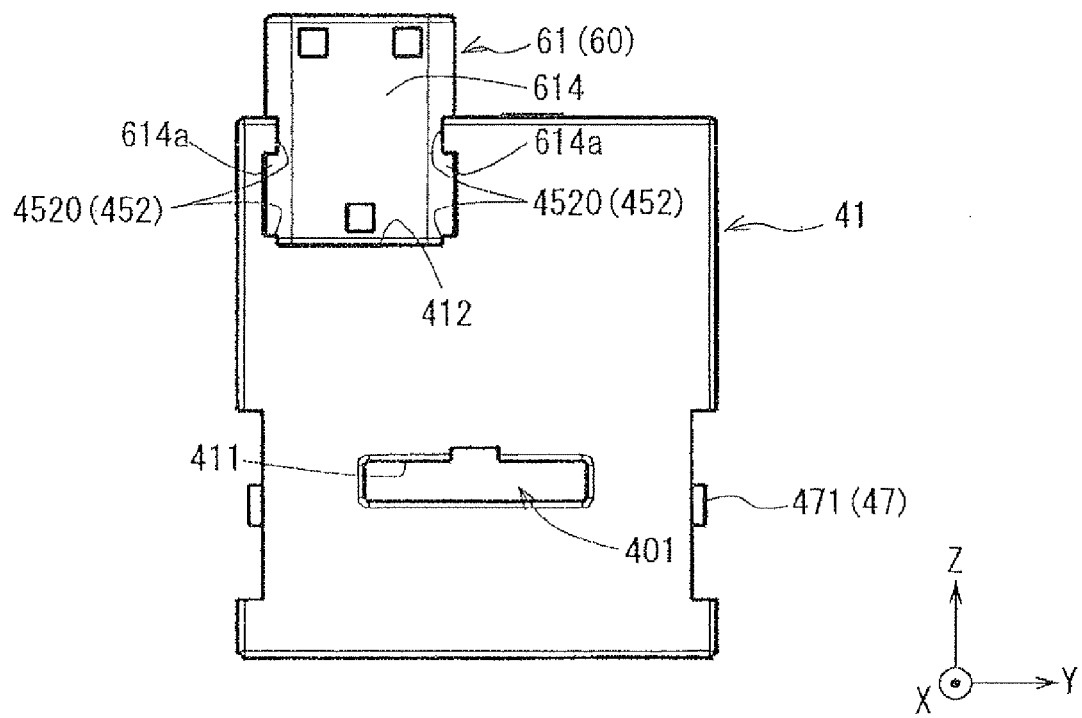
FIG. 8 is a back view of the container member configured to support the connector.
Figure 9:
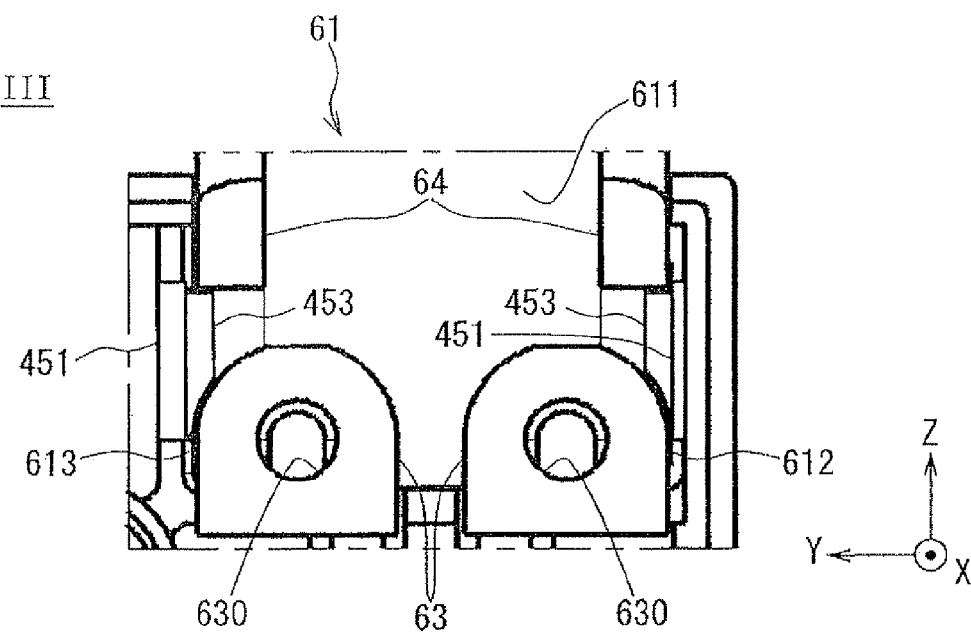
FIG. 9 is a front view of the connector supporting portion configured to support the connector.

Referring now to FIG. 4, FIG. 5, and FIG. 7 to FIG. 9, a supporting structure of the connector 60 in the insulating housing 40 will be described. FIG. 7 is a lateral cross-section of the connector supporting portion 45 configured to support the connector 60, and is a cross-sectional view taken along a II-II plane illustrated in FIG. 5. FIG. 8 is a back view of the container member 41 configured to support the connector 60. FIG. 9 is a front view of the connector supporting portion 45 configured to support the connector 60. FIG. 9 is an enlarged view of a portion surrounded by a frame border III in FIG. 5.

The connector supporting portion 45 may be a portion configured to achieve positioning of the body portion 61 of the connector 60 by a fitting structure in three directions of the first direction (X-axis direction), the second direction (Y-axis direction) and the third direction (Z-axis direction) orthogonal to each other in a state in which the lead terminals 62 of the connector 60 extend in parallel to the first direction (X-axis direction).

More specifically, the connector supporting portion 45 may include a pair of first connector restricting portions 451, a second connector restricting portion 452, and third connector restricting portions 453.

The pair of first connector restricting portions 451 may be portions formed into a plate shape so as to come into contact with the second side surface 612 and the third side surface 613 of the body portion 61 of the connector 60 as illustrated in FIG. 4, FIG. 5, and FIG. 7. The pair of first connector restricting portions 451 may restrict the movement of the body portion 61 of the connector 60 in the second direction (Y-axis direction).

Also, the second connector restricting portion 452 may be a portion configured to come into contact with the fourth side surface 614 of the body portion 61 of the connector 60 and configured to restrict the movement of the body portion 61 of the connector 60 toward the fourth side surface 614 in the first direction (the negative direction of the X-axis) as illustrated in FIG. 4, FIG. 7, and FIG. 8.

In an embodiment, the second connector restricting portion 452 may include a plurality of apprentice portions 4520 formed so as to protrude inwardly beyond edges of the fourth side surface 614 of the body portion 61 of the connector 60. In the example illustrated in FIG. 7 and FIG. 8, four of the apprentice portions 4520 may be formed so as to protrude from the pair of first connector restricting portions 451, respectively. The four apprentice portions 4520 may be formed at positions which form corners of the rectangle when viewed from the first direction.

The plurality of apprentice portions 4520 may be formed so as to protrude in a state of coming into surface contact with chamfered portions 614a of the fourth side surface 614 of the body portion 61 of the connector 60 at edges on both sides which constitute boundary portions with respect to the second side surface 612 and the third side surface 613. Furthermore, the plurality of apprentice portions 4520 may each be formed to be reduced gradually in thickness from a root portion, which may be in contact with an end of the fourth side surface 614, to a distal end portion thereof as illustrated in FIG. 7.

As illustrated in FIG. 8, a remaining portion of the fourth side surface 614 of the body portion 61 of the connector 60, other than portions where the plurality of apprentice portions 4520 contact the fourth side surface, may be entirely exposed from the container member 41 of the insulating housing 40.

The third connector restricting portions 453 may be portions formed so as to protrude inwardly beyond edges of the fourth side surface 614 of the body portion 61 of the connector 60 and enter between the screw seats 63 and the column portions 64 of the body portion 61 fitted between the pair of first connector restricting portions 451 as illustrated in FIG. 4 and FIG. 7. In an embodiment, the pair of third connector restricting portions 453 may be formed so as to protrude respectively from the pair of first connector restricting portions 451 and enter between the screw seats 63 and the column portions 64.

The third connector restricting portions 453 may come into contact with respective side surfaces of the screw seats 63 and the column portions 64 arranged in a line in the third direction (Z-axis direction) as well as with the first side surface 611 of the body portion 61. Accordingly, the third connector restricting portions 453 may restrict the movement of the body portion 61 toward the side where the screw seats 63 project in the first direction (the positive direction in the X-axis direction) and in the third direction (Z-axis direction).

Incidentally, portions of at least one of the pair of first connector restricting portions 451, where the third connector restricting portions 453 may be formed, may preferably be formed into a cantilevered shape so as to have flexibility which allows displacement in the second direction (Y-axis direction). Accordingly, even when the third connector restricting portions 453 protrude from the pair of first connector restricting portions 451, the connector 60 may be fitted between the pair of first connector restricting portions 451 easily.

In an embodiment, a portion of one of the first connector restricting portions 451, which comes into contact with the third side surface 613 of the connector 60 where the third connector restricting portion 453 may be formed, may be formed into a cantilevered shape as illustrated in FIG. 4 and FIG. 7.

As described thus far, positioning of the body portion 61 of the connector 60 may be achieved in the three-dimensional directions by the connector supporting portion 45 including the first connector restricting portions 451, the second connector restricting portion 452, the third connector restricting portions 453 such that the body portion 61 of the connector 60 may be held at a predetermined position in the insulating housing 40.

<Supporting Structure of Circuit Board>

Referring now to FIG. 1, FIG. 3, FIG. 4, FIG. 10, and FIG. 11, a supporting structure of the circuit board 50 in the insulating housing 40 will be described.

The circuit board 50 may be fixed to the substrate fixing portion 46 at one point thereof. As illustrated in FIG. 1 and FIG. 4, the substrate fixing portion 46 may be a portion formed so as to project from the inner surface of the container member 41. Preferably, only one substrate fixing portion 46 is formed at the one substrate fixing portion 46.

As illustrated in FIG. 4, a distal end portion 461 of the substrate fixing portion 46 may be formed with a screw hole 460 which allows tightening of the second screw 72. In addition, the distal end portion 461 of the substrate fixing portion 46 may be formed to have a size coming into tight contact with an inner surface of the second through hole 52 formed in the circuit board 50 while being fitted therein.

The distal end portion 461 of the substrate fixing portion 46 may be formed to be thinner than a portion on the root side thereof by the intermediary of a shouldered portion 462. The length of the substrate fixing portion 46 from the shouldered portion 462 to a distal end may be formed to be substantially the same as, or slightly shorter than the thickness of the circuit board 50.

The circuit board 50 may be assembled to the container member 41 in a state in which the magnetic core 10, the Hall element 20, and the connector 60 are supported respectively by the core supporting portions 43, the element supporting portion 44 and the connector supporting portion 45.

As illustrated in FIG. 1, an edge portion of the circuit board 50 may be formed with a notched portion 55 for positioning.

As illustrated in FIG. 4, a side wall of the container member 41 may be formed with a guide rib 48 configured to fit into the notched portion 55 of the circuit board 50 on the inner surface thereof.

The circuit board 50 may be assembled to the container member 41 in a direction in which the guide rib 48 of the container member 41 fits into the notched portion 55. Accordingly, the lead terminals 22 of the Hall element 20 may fit into the Hall element mounting holes 53, the lead terminals 22 of the connector 60 fit into the connector mounting holes 54, and the distal end portion 461 of the substrate fixing portion 46 may fit into the second through hole 52. Furthermore, the screw holes 630 formed in the two screw seats 63 of the connector 60 and the two first through holes 51 of the circuit board 50 may be aligned.

Then, the connector 60 may be fixed to the circuit board 50 by the two first screws 71 screwed into the screw holes 630 of the screw seats 63 of the connector 60. Also, the circuit board 50 may be held tightly between the shouldered portion 462 of the substrate fixing portion 46 and the head portion of the second screw 72 and may be fixed to the substrate fixing portion 46 by the one second screw 72 screwed into the screw hole 460 of the substrate fixing portion 46.

The guide rib 48 of the container member 41 fitted into the notched portion 55 of the circuit board 50 prevents the circuit board 50 from being turned around together when the second screw 72 is screwed into the screw hole 460 of the substrate fixing portion 46.

The lead terminals 22 of the Hall element 20 inserted into the Hall element mounting holes 53 and the lead terminals 22 of the connector 60 inserted into the connector mounting holes 54 may be secured to the circuit board 50 by soldering.

When all the components are accommodated within the container member 41, the lid member 42 may be combined with the container member 41, and the container member 41 and the lid member 42 may be held in a state of being unified by the lock mechanism 47 as the insulating housing 40.

When the container member 41 and the lid member 42 are combined, at least two portions of the circuit board 50 may be held tightly between a projecting portion on the inner surface of the container member 41 and a projecting portion on the inner surface of the lid member 42.

As described above, the four core supporting portions 43 may be formed so as to project from the inner surface of the container member 41. Two in-core supporting portions 43a from among the four supporting portions 43 may project so as to penetrate through the hollow portion 11 of the magnetic core 10.

In contrast, as illustrated in FIG. 10 and FIG. 11, a substrate holding portion 423 facing the two in-core supporting portions 43a may be formed so as to project from the inner surface of the lid member 42. The circuit board 50 may be held tightly between top surfaces of the two in-core supporting portions 43a of the container member 41 and a top surface of the substrate holding portion 423 of the lid member 42.

As illustrated in FIG. 5, the substrate fixing portion 46 and the two in-core supporting portions 43a may be arranged at positions corresponding to apexes of a triangle surrounding a depression of the element supporting portion 44 when viewed from the first direction (X-axis direction). The circuit board 50 may be fixed at the substrate fixing portion 46 with the second screw 72, and may be fixed at positions of the two in-core supporting portions 43a by being tightly held from both of front and back surfaces.

In an embodiment, a substrate holding portion 413 configured to hold the circuit board 50 tightly in cooperation with the substrate holding portion 423 of the lid member 42 may be formed so as to project also between the two in-core supporting portions 43a of the container member 41. The substrate holding portion 413 may serve to supplement a force of the two in-core supporting portions 43a to hold the circuit board 50.

Therefore, the circuit board 50 may be fixed at the three points corresponding to apexes of a triangle surrounding the mounting position of the Hall element 20. Accordingly, the warping of the portion of the circuit board 50 where the Hall element 20 is mounted may be prevented. Consequently, the positional displacement of the Hall element 20 due to the warping of the circuit board 50 may be inhibited.

EFFECTS

In the current detecting apparatus 1, the general-purpose connector 60 including the body portion 61 and the lead terminals 62 integrated into a unit may be employed. Positioning of the magnetism detecting portion 21 of the Hall element 20 and the body portion 61 of the connector 60 may be achieved by the container member 41 in a state in which the lead terminals 22 and 62 thereof extend in parallel to the same direction (first direction) by such a simple assembling process as to fit into part of the container member 41.

The container member 41 which may be an integrally molded member formed of a resin material may be formed with high degree of dimensional accuracy. Therefore, positioning of the lead terminals 22 of the Hall element 20 and the lead terminals 62 of the connector 60 with high degree of accuracy may be achieved by the container member 41.

Therefore, even when the circuit board 50 is assembled to the container member 41 after the Hall element 20 and the connector 60 have been assembled to the container member 41, the circuit board 50 may be assembled to a correct position. Consequently, a problem that the position of the Hall element 20 mounted on the circuit board 50 is deviated from the correct position, and a problem that the needless stress is applied to the magnetism detecting portion 21 of the Hall element 20 may be avoided, and deterioration of the current detection accuracy caused by these problems may be also avoided.

Generally, in order that the circuit board 50 is firmly fixed to the container member 41, the circuit board 50 is fixed to the container member 41 at least at two points. In contrast, in the current detecting apparatus 1, positioning of the connector 60 to be fixed to the circuit board 50 may be achieved by the connector supporting portion 45 of the container member 41 in the three-dimensional directions.

Therefore, the circuit board 50 may be brought into a state of being substantially fixed to the container member 41 at two points of the substrate fixing portion 46 and the connector supporting portion 45 only by being fixed at one point by the second screw 72 and the substrate fixing portion 46. Consequently, the assembling process may be simplified in a state in which the strength of fixation of the circuit board 50 with respect to the container member 41 may be sufficiently secured.

From the description given above, with the employment of the current detecting apparatus 1, the Hall element 20, the connector 60, and the circuit board 50 on which the Hall element 20 and the connector 60 are mounted may be firmly fixed with high degree of positional accuracy while employing the general-purpose connector 60 in the simple assembling process. Consequently, the mounting error of the components may be prevented, and variations in detection accuracy of the current detecting apparatus 1 may be reduced.

The general-purpose connector configured to be fixable to the circuit board with a screw is generally formed with the two screw seats 63 and the two column portions 64, which are four projecting portions arranged at positions of corners of a rectangular in many cases in the same manner as the connector 60 of an embodiment. With the employment of the current detecting apparatus 1, positioning of the connector 60 may be achieved by the connector supporting portion 45 having a simple structure by using a plurality of projecting portions provided on the general-purpose connector 60.

Also, the general-purpose connector may be chamfered at boundary portions (corner portions) of the four side surfaces in many cases in the same manner as the connector 60 of an embodiment. As illustrated in FIG. 7, the plurality of apprentice portions 4520 which constitute the second connector restricting portion 452 may be formed to have a thickness which fills the chamfered portions 614a on a side surface of the connector 60. In this manner, by using the chamfered portions 614a on the side surface of the general-purpose connector 60, the dimension in the first direction (X-axis direction) of the container member 41 (the insulating housing 40) may be reduced.

<Others>

In an embodiment described above, the second connector restricting portion 452 may be composed of the plurality of apprentice portions 4520. However, it is also contemplated that the second connector restricting portion 452 corresponds to a plate-shaped portion coming into contact with an area of the fourth side surface 614 of the body portion 61 of the connector 60 from the second side surface 612 side to the third side surface 613 side. However, in this case, the dimension in the first direction (X-axis direction) of the insulating housing 40 may be increased by an amount corresponding to the thickness of the plate-shaped second connector restricting portions 452.

It is also contemplated that the third connector restricting portions 453 may be projecting portions which hold tightly a side surface of at least one of the two screw seats 63 and the column portions 64 of the connector 60 therebetween.

REFERENCE SIGNS LIST 1 current detecting apparatus
10 magnetic core
11 hollow portion of the magnetic core
12 gap portion of the magnetic core
13 end portion of the magnetic core
20 Hall element
21 magnetism detecting portion of Hall element
22 lead terminals of Hall element
30 transmission channel
40 insulating housing
41 container member
42 lid member
43 core supporting portion
43a in-core supporting portions
44 element supporting portion
45 connector supporting portion
46 substrate fixing portion
47 lock mechanism
48 guide rib
50 circuit board
51 first through hole
52 second through hole
53 Hall element mounting hole
54 connector mounting hole
55 notched portion of the circuit board
61 body portion of the connector
62 lead terminal of the connector
63 screw seat (projecting portion) of the connector
64 column portion (projecting portion) of the connector
71 first screw
72 second screw
401 current pass hole
411 outer frame portion
412 void portion
413, 423 substrate holding portion
421 inner frame portion
422 core holding portion
451 first connector restricting portion
452 second connector restricting portion
453 third connector restricting portion
460 screw hole of the substrate fixing portion
461 distal end portion of the substrate fixing portion
462 shouldered portion of the substrate fixing portion
471 claw portion (lock mechanism)
472 frame portion (lock mechanism)
610 connecting port
611 first side surface of the body portion of the connector
612 second side surface of the body portion of the connector
613 third side surface of the body portion of the connector
614 fourth side surface of the body portion of the connector
614a chamfered portion
630 screw hole of the screw seat of the connector
4520 apprentice portion (second connector restricting portion)

The invention claimed is:

1. A current detecting apparatus comprising:
a magnetic core formed of a magnetic material, the magnetic core including two ends facing each other via a gap between the two ends and being formed continuously so as to surround a hollow portion;
a magnetoelectric device including:
a magnetism detecting portion arranged in the gap, and
a first lead terminal extending from the magnetism detecting portion,
the magnetoelectric device being configured to detect a magnetic flux that varies with electric current passing through the hollow portion;
a connector having a body and a second lead terminal extending from the body; a circuit board to which the first lead terminal and the second lead terminal are secured, and to which the body is fixed by a fixing arrangement other than a connection between the second lead terminal and the circuit board, the fixing arrangement preventing the body from pulling away from the circuit board; and
a housing including a container and a lid to be combined with the container, the container and the lid each being formed of an integrally molded member of a resin material having insulating properties, and the container being configured to accommodate and support the magnetic core, the magnetoelectric device, and the circuit board in a certain positional relationship, wherein;
the circuit board is between the connector and the lid; and
the container includes
an element supporting portion that forms a depression in which the magnetism detecting portion is fitted at the gap,
a connector supporting portion that positions the body, by a fitting structure, in three directions orthogonal to each other including a first direction in which the second lead terminal extends in parallel to the first lead terminal, and a substrate fixing portion where the circuit board is fixed at one point.

2. The current detecting apparatus according to claim 1, wherein the body includes four side surfaces and a plurality of projections that project from a first side surface of the four side surfaces, the first side surface facing such that the first side surface is approximately perpendicular to the first direction, and the projecting portions contacting a top of the circuit board, the connector supporting portion includes a pair of first connector restricting portions that contact a second side surface and a third side surface of the four side surfaces, the second side surface and the third side surface being located on two sides of the first side surface, and that restrict a movement of the body in a second direction orthogonal to the first direction, a second connector restricting portion that contacts a fourth side surface of the four side surfaces, the fourth side surface being opposite the first side surface, and that restricts the movement of the body in a direction opposite to the first direction, and third connector restricting portions that protrude from opposing surfaces of the pair of first connector restricting portions, that are disposed between the plurality of projecting portions, that contact side surfaces of the plurality of projecting portions, that contact the first side surface, and that restrict the movement of the body portion in the first direction and in a third direction orthogonal to the first direction and the second direction.

3. The current detecting apparatus according to claim 2, wherein the second connector restricting portion includes a plurality of apprentice portions that protrude inwardly beyond edges of the fourth side surface of the body portion of the connector while in contact with chamfered portions of the fourth side surface, the edges being formed at the second side surface and the third side surface, the apprentice portions being gradually thinner from a root portion, which comes into contact with the fourth side surface, toward a distal end of the apprentice portions, and a remaining portion of the fourth side surface, other than where the apprentice portions come into contact with the fourth side surface, is entirely exposed from the housing.

4. A current detecting apparatus comprising:

a magnetic core formed of a magnetic material, the magnetic core including two ends facing each other via a gap between the two ends and being formed continuously so as to surround a hollow portion;

a magnetoelectric device including:
   a magnetism detecting portion arranged in the gap, and
   a first lead terminal extending from the magnetism detecting portion,
   the magnetoelectric device being configured to detect a magnetic flux that varies with electric current passing through the hollow portion;

a connector having a body and a second lead terminal extending from the body;

a circuit board to which the first lead terminal and the second lead terminal are secured, and to which the body is fixed; and a housing including a container and a lid to be combined with the container, the container and the lid each being formed of an integrally molded member of a resin material having insulating properties, and the container being configured to accommodate and support the magnetic core, the magnetoelectric device, and the circuit board in a certain positional relationship, wherein:

the container includes an element supporting portion that forms a depression in which the magnetism detecting portion is fitted at the gap, a connector supporting portion that positions the body, by a fitting structure, in three directions orthogonal to each other including a first direction in which the second lead terminal extends in parallel to the first lead terminal, and a substrate fixing portion where the circuit board is fixed at one point;

the body includes four side surfaces and a plurality of projections that project from a first side surface of the four side surfaces, the first side surface facing such that the first side surface is approximately perpendicular to the first direction, and the projecting portions contacting a top of the circuit board; and the connector supporting portion includes a pair of first connector restricting portions that contact a second side surface and a third side surface of the four side surfaces, the second side surface and the third side surface being located on two sides of the first side surface, and that restrict a movement of the body in a second direction orthogonal to the first direction, a second connector restricting portion that contacts a fourth side surface of the four side surfaces, the fourth side surface being opposite the first side surface, and that restricts the movement of the body in a direction opposite to the first direction, and third connector restricting portions that protrude from opposing surfaces of the pair of first connector restricting portions, that are disposed between the plurality of projecting portions, that contact side surfaces of the plurality of projecting portions, that contact the first side surface, and that restrict the movement of the body portion in the first direction and in a third direction orthogonal to the first direction and the second direction.

5. The current detecting apparatus according to claim 4, wherein the second connector restricting portion includes a plurality of apprentice portions that protrude inwardly beyond edges of the fourth side surface of the body portion of the connector while in contact with chamfered portions of the fourth side surface, the edges being formed at the second side surface and the third side surface, the apprentice portions being gradually thinner from a root portion, which comes into contact with the fourth side surface, toward a distal end of the apprentice portions, and a remaining portion of the fourth side surface, other than where the apprentice portions come into contact with the fourth side surface, is entirely exposed from the housing.

6. The current detecting apparatus according to claim 4, wherein the circuit board is between the connector and the lid.

* * * * *